United States Patent [19]
Yoshimura

[11] Patent Number: 5,848,076
[45] Date of Patent: Dec. 8, 1998

[54] MEMORY CARD WITH CAPABILITY OF ERROR CORRECTION AND ERROR CORRECTION METHOD THEREFORE

[75] Inventor: Yoshimasa Yoshimura, Tokyo, Japan

[73] Assignee: Mitsubishi Denki Kabushiki Kaisha, Tokyo, Japan

[21] Appl. No.: 763,101

[22] Filed: Dec. 10, 1996

[30] Foreign Application Priority Data

Jun. 10, 1996 [JP] Japan .................................. 8-147177

[51] Int. Cl.$^6$ ................................................. G11C 29/00
[52] U.S. Cl. ...................................... 37/40.11; 371/40.18
[58] Field of Search ............................... 371/40.18, 40.11

[56] References Cited

U.S. PATENT DOCUMENTS

| | | | |
|---|---|---|---|
| 4,371,963 | 2/1983 | Edwards, Jr. et al. | 371/50 |
| 4,464,752 | 8/1984 | Schroeder et al. | 371/38 |
| 4,888,773 | 12/1989 | Arlington et al. | 371/40.2 |
| 5,455,939 | 10/1995 | Rankin et al. | 395/182.04 |
| 5,467,357 | 11/1995 | Asami | 371/21.3 |
| 5,488,691 | 1/1996 | Fuoco et al. | 395/185.05 |
| 5,590,306 | 12/1996 | Watanabe et al. | 395/442 |
| 5,606,529 | 2/1997 | Honma et al. | 365/230.03 |
| 5,611,067 | 3/1997 | Okamoto et al. | 395/430 |
| 5,663,901 | 9/1997 | Wallace et al. | 365/52 |

FOREIGN PATENT DOCUMENTS

| | | |
|---|---|---|
| 4223273 C2 | 1/1993 | Germany . |
| 4416171 C2 | 1/1995 | Germany . |
| 4337857 | 11/1992 | Japan . |
| 05020896 A | 1/1993 | Japan . |
| 7161843 | 6/1995 | Japan . |

*Primary Examiner*—Stephen M. Baker

[57] ABSTRACT

The memory card of the present invention includes an error correction circuit having an error correction code (ECC) computing circuit for computing the error correction codes, in blocks, for the data stored in a main memory, an ECC memory for storing the error correction codes computed by the ECC computing circuit, an ECC control circuit for comparing error correction codes computed for updated data with error correction codes previously computed for corresponding original data stored in the ECC memory, and for producing a signal indicating the result of the comparison, and an error correction controller for finding and correcting errors based on the result of the comparison produced by the ECC control circuit.

14 Claims, 10 Drawing Sheets

MEMORY CARD WITH CAPABILITY OF ERROR CORRECTION AND ERROR CORRECTION METHOD THEREFORE

BACKGROUND OF THE INVENTION

1. Field of the Invention

The present invention relates generally to a memory card and, more particularly, to a memory card with a capability of error correction and to an error correction method for the memory card.

2. Description of the Prior Art

A memory card utilizing rewritable SRAM or flash memory can be disconnected from an information processing device and can hold data stored in the memory without applying external power. Accordingly, a memory card utilizing rewritable SRAM or flash memory is often removed or disconnected from an information processing device and is stored, keeping data in the memory card, somewhere outside the information processing device. In some cases data bits in the memory card change their states during data hold due to software error or data evaporation so that correct data cannot be retrieved. Although the probability of this failure is very low, the number of occurrences will increase since memory capacity is growing larger and the number of units shipped to the marketplace is increasing.

No memory card, utilizing SRAM or flash memory, has been developed that has the capability of self consistent error correction for data errors that occur during data hold. Since the number of occurrences of data error during data hold is expected to increase as the capacity of memory card increases, it is becoming more likely to read but error data caused during data hold.

One of the data error correction methods uses error correction codes (referred to as ECC hereinafter) for the memory card. If every byte or every word has an ECC, however, the memory needs a large capacity for the ECCs. For example, the ECC needed for 8-bit data is 4-bits and, hence, a 2 MByte ECC capacity is necessary for a 4 MByte main memory. The memory card cannot have this much capacity due to the restrictions of mounting various parts.

One solution for decreasing the capacity of ECCs is to use ECCs for each block consisting of a few bytes. Using a larger block size saves additional relative memory capacity needed for the ECCs. However, a drawback is that in data update the ECCs must be computed on the basis of the data of the entire block and that the data access time becomes longer as the data length of the block becomes larger.

SUMMARY OF THE INVENTION

An essential object of the present invention, therefore, is to solve the aforementioned problem and to provide a memory card that has a large capacity, a short data access time, and the capability of data error correction.

The memory card of the present invention is rewritable, is capable of holding its data when disconnected from the information processing device, comprises a main memory that stores data in units of blocks of a predetermined byte length, and further comprises an error correction means for computing the error correction codes for all the data in a block, for finding errors in the data based on the computed error correction codes, and for correcting them.

The aforementioned error correction means detects, by means of the error correction codes, errors generated to data stored in a main memory such as SRAM and flash memory due to software error, for example, and then corrects those errors.

Preferably the error correction means of the memory card comprises an ECC computing unit for computing the error correction codes for all the data stored in a block of the memory elements; an ECC memory unit for storing the error correction codes computed by the ECC computing unit; an ECC control unit for comparing the error correction codes computed by the ECC computing unit for data to be retrieved with the error correction codes for the same data which have previously been computed and have been stored in the ECC memory unit and for producing a signal indicating the result of the comparison; and an error correction control unit for finding and correcting an error based on the result of the comparison produced by the ECC control unit.

Preferably the memory card further comprises a rechargeable battery means for providing power to both the main memory and the error correction means for a predetermined period of time after the memory card is disconnected from the information processing device.

The battery means provides power to the main memory and the error correction means after the memory card is disconnected from the information processing device and, accordingly, after the power from the information processing device is shut off. The battery means allows the error correction means to perform the update operation on the error correction codes even after the memory card is disconnected from the information processing device.

Preferably the error correction means of the memory card further comprises a flag means for indicating that data has been written in a particular block.

The error correction means sets a flag for a block in which new data is written. The error correction means obtains, by referring to the flag of a block, information as to whether or not the particular block of the memory elements has had a data update. Thus the error correction means is able to compute the error correction codes for only those blocks which have had a data update.

Preferably the ECC computing unit of the memory card computes the error correction codes for updated data by first computing the difference data, which is a difference between the bytes to be rewritten of the updated data and the corresponding bytes of the original data which has been stored in the same area as the updated data, then computing the difference error correction codes, which are the error correction codes for the difference data, and finally by adding the difference error correction codes to the original error correction codes for the original data.

In order to compute the error correction codes for updated data, the ECC computing unit first computes the difference between the updated bytes and their corresponding original bytes where the updated bytes are the bytes which have actually been altered from their original bytes. The difference is referred to as the difference data. The ECC computing unit then computes the error correction codes only for the difference data. The error correction codes computed in the above are added to the original error correction codes to obtain the error correction codes for the updated data. With this method the error correction codes for the updated data are not computed for the entire block but only for the bytes which have actually been altered from the original bytes.

The first method of error correction of the present invention is applied to a rewritable memory card comprising a main memory that stores data in units of blocks having a predetermined byte length and are capable of holding data when disconnected from the information processing device. This method comprises the following steps: (a) reading data, stored in the main memory, in blocks; (b) computing the error correction codes for the data which has been read in blocks; (c) comparing the error correction codes just computed with the error correction codes previously computed for the data which has been stored in the main memory; and (d) identifying data errors based on the result of the comparison and correcting the errors. The memory card performs data correction on the data stored in the main memory when the memory card is connected to the information processing device or when the memory card receives a control signal from the information processing device.

With this first method of error correction, when the memory card is connected to the information processing device or when the memory card receives a control signal from the information processing device, data stored in the main memory is read in blocks and the error correction codes for the data are computed. The error correction codes just computed are compared with the error correction codes which have previously been computed for the same data. Data errors are identified on the basis of the result of the comparison, and the errors of the data stored in the memory card are corrected.

The second method of data correction is also applied to a rewritable memory card having a main memory that stores data in units of blocks having a predetermined byte length and are capable of holding data when disconnected from the information processing device. This second method comprises the following steps: (a) reading data, stored in the memory elements, in blocks; (b) computing the error correction codes for the data which has been read in blocks; and (c) updating the error correction codes previously computed for the data with the newly computed error correction codes. The memory card updates the error correction codes for the data stored in the main memory all at once when the memory card is removed from the information processing device or when the memory card receives a control signal from the information processing device.

With this second method of data correction, the error correction codes are not updated every time data is written in the memory card. The update operation is performed on the data stored in the main memory all at once when the memory card is removed from the information processing device or when the memory card receives a control signal from the information processing device.

The third method of data correction is also applied to a rewritable memory card having a main memory that stores data in units of blocks having a predetermined byte length and is capable of holding data when disconnected from the information processing device. In order to compute the error correction codes for updated data this third method comprises these steps: (a) computing the difference data, which is a difference between the bytes of the updated data to be rewritten and the corresponding bytes of the original data which has been stored in the same area as the updated data; (b) computing the difference error correction codes which are the error correction codes for the difference data, and (c) adding the difference error correction codes to the original error correction codes for the original data.

This third method of data correction includes the computation of the error correction codes for the updated data. The memory card first computes the difference between the updated bytes and their corresponding original bytes, where the updated bytes are the bytes which have actually been altered from the original bytes. The difference is referred to as the difference data. Then only the error correction codes for the difference data are computed. The error correction codes just computed are added to the original error correction codes to obtain the error correction codes for the updated data. With this method the error correction codes for the updated data are not computed for the entire block but only for those bytes which have actually been altered from the original bytes.

BRIEF DESCRIPTION OF THE DRAWINGS

These and other objects and features of the present invention will become clear from the following description taken in conjunction with the preferred embodiment thereof with reference to the accompanying drawings throughout which like parts are designated by like reference numerals, and in which.

DETAILED DESCRIPTION OF THE PREFERRED EMBODIMENT

The present invention will be described with reference to embodiments shown in the accompanying drawings.

Embodiment 1.

Figure 1:
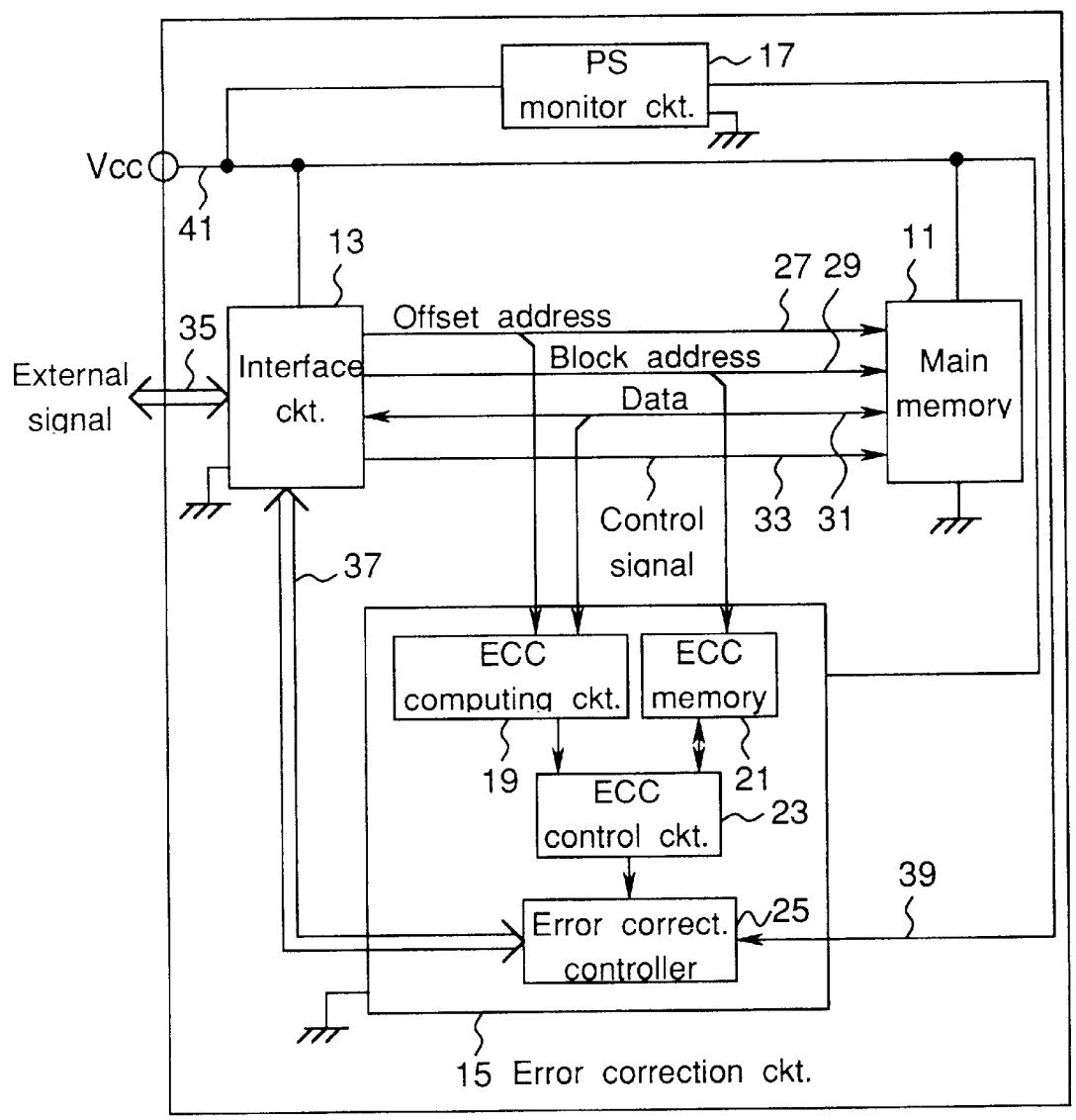
FIG. 1 is a block diagram of the memory card of Embodiment 1 of the present invention.

FIG. 1 shows a block diagram of the memory card according to Embodiment 1 of the present invention. The memory card comprises a main memory 11, formed with flash memory, for storing data; an interface circuit 13 for exchanging data between the main memory 11 and the other circuit of the memory card or an external information processing device (not shown) by setting data and address data; an error correction circuit 15 for correcting errors of data stored in the main memory 11; and a power supply monitor circuit 17 for monitoring the power supply voltage provided from the information processing device through a terminal Vcc and producing appropriate control signals.

The ECC error correction circuit 15 comprises an ECC computing circuit 19 for computing ECCs; an ECC memory 21 for storing the ECCs computed on the data stored in the main memory 11; an ECC control circuit 23 for comparison of the ECCs; and an error correction controller 25 for controlling writing of corrected data and for controlling the other circuits. The ECC computing circuit 19 includes an ECC computation table which is referred to when the ECCs are computed. The interface circuit 13 is connected to the main memory 11 through an offset address bus 27, a block address bus 29, a data bus 31, and a control signal bus 33. The error correction circuit 15 is connected to the offset address bus 27, the block address bus 29, and the data bus 31. The error correction circuit 15 is also connected to the interface circuit through the bus 37.

Data is written to or read from the main memory 11 through the data bus 31. An address is set in the main memory via the offset address bus 27 and the block address bus 29. The offset address bus 27 and the block address bus 29 will be explained later. The control bus 33 transmits control signals such as the write enable signal to the main memory 11.

The power supply monitor 17 checks to find out whether the power supply voltage provided by the information processing device is equal to or higher than a predetermined voltage and then sends control signals to the error correction circuit 15, which, in turn, determines, with this signal, whether or not the memory card is connected to the information processing device. The operation of the memory card is described below.

Figure 2:
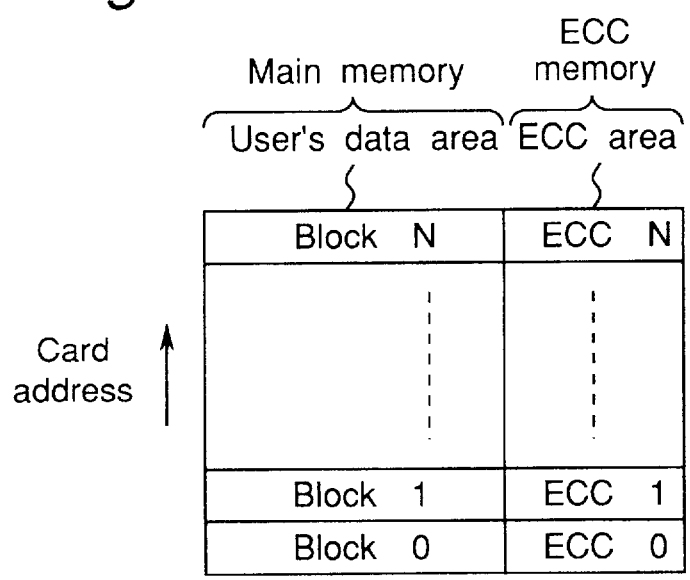
FIG. 2 shows the memory space of the main memory and the ECC memory.

First, referring to FIG. 2, the memory space of the main memory 11 and the ECC memory 21 of the present embodiment will be described. As shown in FIG. 2 the area of the main memory 11 is divided into blocks of the same size, and each block corresponds to one ECC associated with the data stored in that block. These blocks are specified with the block addresses and each byte in the block is specified with an offset address. In the present embodiment the main memory 11 is assumed to be divided into N blocks.

The memory card of the present embodiment performs a process called an "initializing process" in which it detects errors created in the data stored in the main memory 11 and corrects them based on their ECCs. The "initializing process" is typically performed immediately after the memory card is connected to the information processing device. More specifically, when the memory card is connected to the information processing device, the power is supplied from the information processing device to the memory card. The power supply monitor circuit 17 checks to determine whether the voltage is equal to or more than a predetermined voltage and produces a signal based on the detected voltage. Receiving this signal, the error correction circuit 15 determines that the memory card is connected to the information processing device and starts the initializing process, which will be described below.

Figure 3:
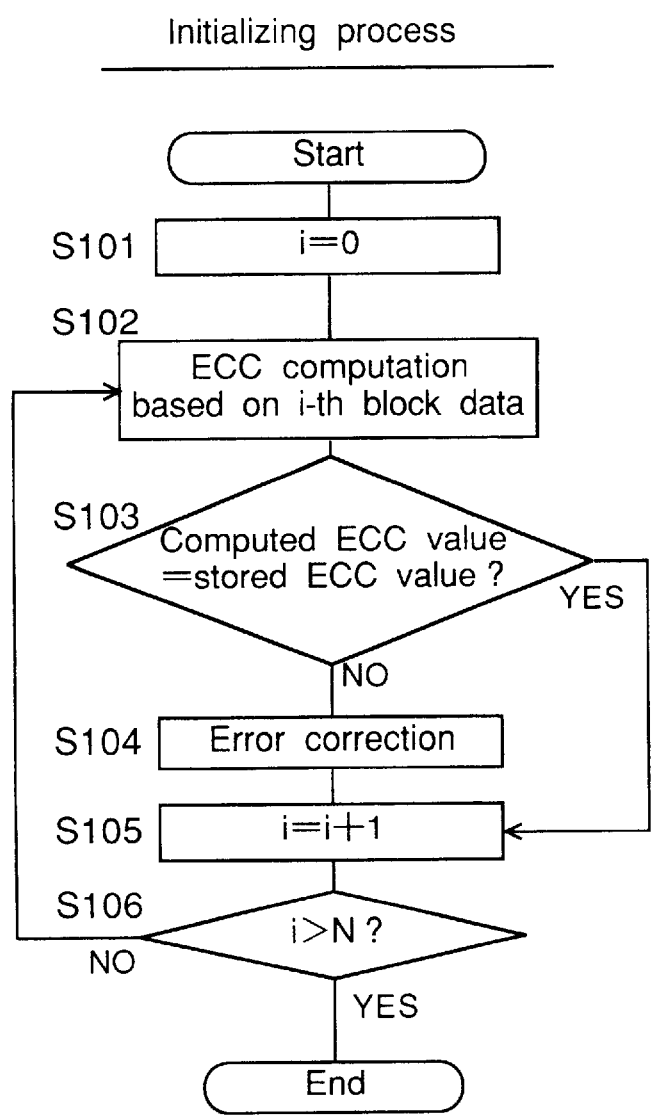
FIG. 3 is a flow chart of the initializing process of the memory card of Embodiment 1.

FIG. 3 is a flow chart of the initializing process of the memory card of the present embodiment. First, the error correction controller 25 initializes the index i to zero which indicates the block number to be processed (S101). Next the error correction controller 25 sends the block address of the i-th block to the main memory 11 through the block address bus 29 and transfers the data of the i-th block to the ECC computing circuit 19 via the data bus 31 (i=0, . . . , N). The ECC computing circuit 19 performs the ECC computation on the retrieved data (S102). The ECC computation will be described in detail later.

The ECC memory 21 stores the ECC values computed when the last write operation was performed. When the ECC computation for the data of the i-th block is completed, the ECC control circuit 23 compares the ECC value just computed at the ECC computing circuit 19 with the ECC value stored in the ECC memory 21 (S103). If the two ECC values are the same, the operation advances to the step S105. If they are different, the error correction controller 25 determines that errors occurred and performs error correction (S104). The error bits are identified by the error correction controller 25 when the ECC values are compared in the step 103. (The procedure of identifying error bits will be explained later.) Then the error correction controller 25 sends to the interface circuit 13 the offset address and the block address to specify the error bits and the correct data and causes the interface circuit 13 to write the correct data in the main memory 11.

After correcting the errors the operation advances to the step S105, where the index i is incremented by one to specify the next data block to be used. Since this error correction process must be performed for all the blocks, the index i and the number of blocks N are compared in the step S106. If the index is not greater than N, that is, if the error correction has not been performed for all the blocks, the operation goes back to the step S102 where another error correction process starts for the next block. The steps S102 through S106 are repeated while i is less than or equal to N, in other words, until the error correction process is performed on all the blocks.

Thus, the initializing process of the present embodiment performs the error correction when the memory card is connected to an information processing device and accordingly improves the reliability of data stored in the memory card. Also, since the ECCs are computed for each block, their size is small and the necessary capacity of the ECCs relative to the total capacity is also small.

In the aforementioned description the initializing process is performed immediately after the memory card is inserted into an information processing device. However, it should be noted that, instead, a control signal from the information processing device can also begin the initializing process either periodically or at an arbitrary time.

Figure 4:
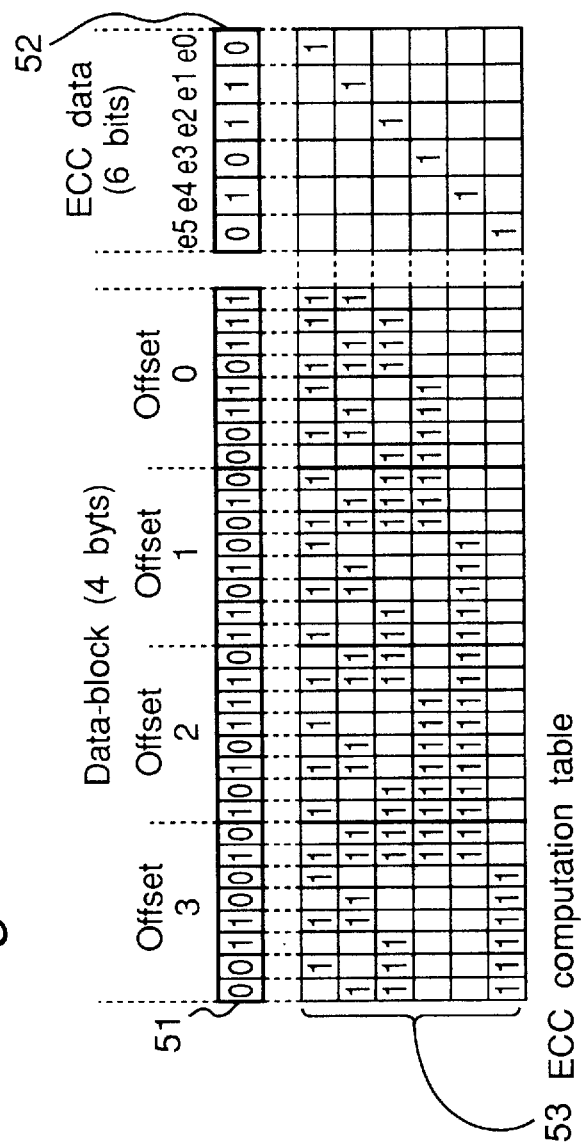
FIG. 4 shows the procedure for the ECC computation.

Next, the procedure of the ECC computation is described below with reference to FIG. 4. The present embodiment uses the Hamming error correction codes. FIG. 4 shows data stored in a data block 51, ECC data 52 associated with the data block 51, and an ECC computation table 53 for computing the ECC data 52. The data block length is assumed to be four bytes (32 bits) for simplification. The required ECC data length for this data block length is 6 bits.

A bit of the ECC data 52 is computed as follows: first, select bits of the data block 51 that correspond to the bits set in one of the rows of the ECC computation table 53; add those selected bits in modulo-two; and the ECC bit corresponding to this particular row is determined so that the sum of the ECC bit and the sum of the selected bits is a 0 also in modulo-two. The e0 is computed by using the first row of the ECC computation table 53, the e1 is computed by using the second row, and so on. The e5 is computed by using the last row. The addition in modulo-two is as follows: 1+0=0+1=1 and 1+1=0+0=0.

The computation of the e0 bit of the ECC data 52 will be explained below as an example. The e0 bit is computed using the first row of the ECC computation table 53. More specifically, the bits of the data block 51 (the offset 0–the offset 3) that correspond to the bits set in the first row of the ECC computation table 53 are added in modulo-two. In this case it is a "0". The e0 bit is determined so that the sum of the "0" computed in the above and the e0 bit is "0". Therefore, the e0 is a "0". Similarly, in order to obtain the e1 bit the bits of the data block 51 that correspond to the bits set in the second row of the ECC computation table 53 are added in modulo-two. In this case it is a "1". The e1 bit is determined so that the sum of the "1" computed in the above and the e1 bit is 0. Therefore, the e1 is a "1". The other bits e2 to e5 are determined in a similar way.

Next, the procedure for identifying an error bit using the ECC data 52 will be described below. First, the ECC bits computed and stored when the data had been written and the ECC bits just computed when the data was read are compared, and the ECC bits that do not match each other are identified. Locate the rows associated with those ECC bits that do not match. Next find a bit of the data block which has corresponding bits of those rows of the ECC computation table all set to "1". The bit of the data block thus found is an error bit.

For example, suppose that, in the step S104, the e0, e2, and e4 bits of the just computed ECC data do not match those stored in the ECC memory 21. Then find a bit of the data block which has corresponding bits of the first, third, and fifth rows of the ECC computation table 53 which are all set to "1". In FIG. 4, the bit of the data block is the first one in the offset 1. Therefore, this bit is an error bit. Once an error bit is identified, its bit is reversed, from "1" to "0" or vice versa, to get a correct bit. Thus, the error correction method of the present embodiment can correct a one-bit error within one block.

Next, the ECC update procedure wherein the data is updated will be described. The memory card of the present embodiment computes the ECCs only for bytes that are rewritten rather than for the entire data block thus making the ECC computation more efficient.

Figure 5:
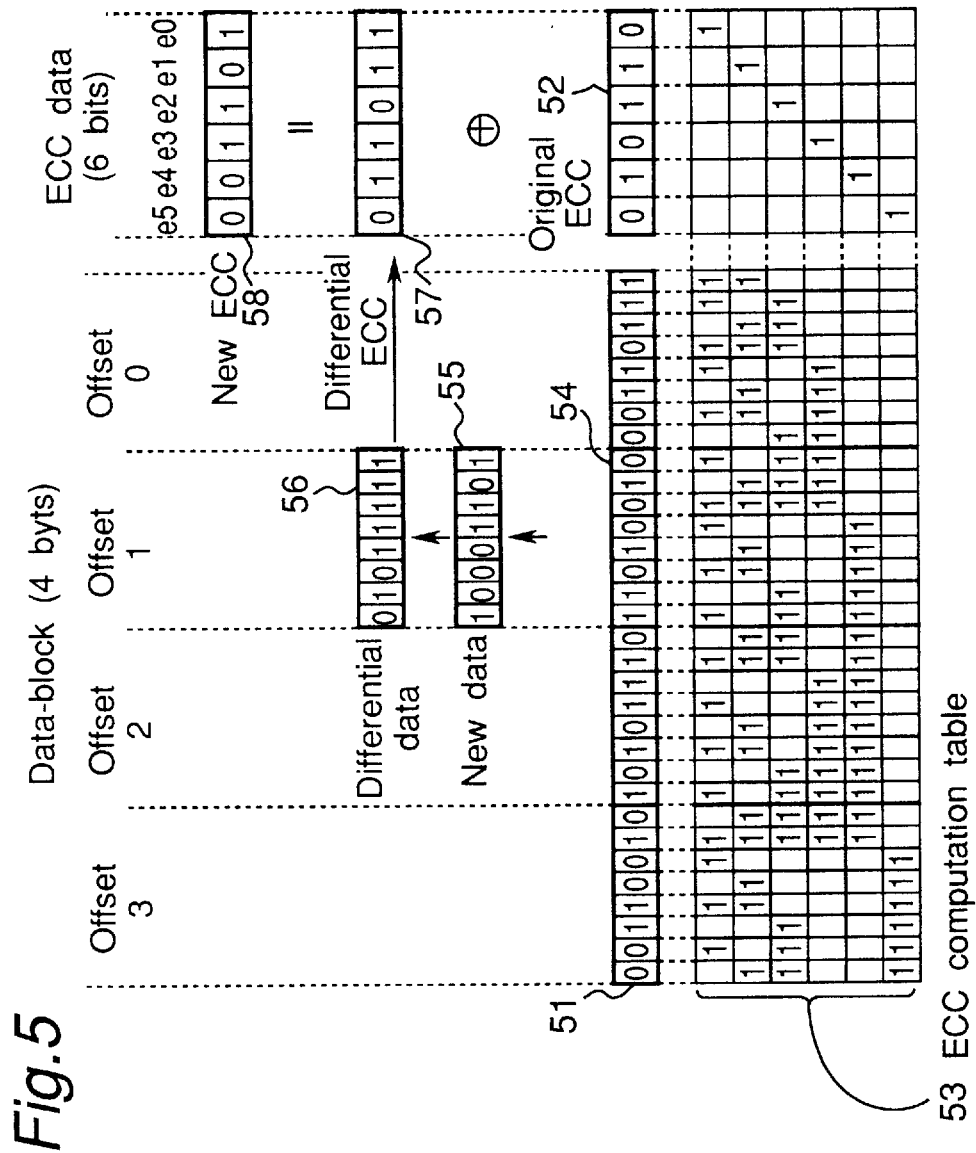
FIG. 5 shows the procedure for the ECC computation for a byte.
Figure 6:
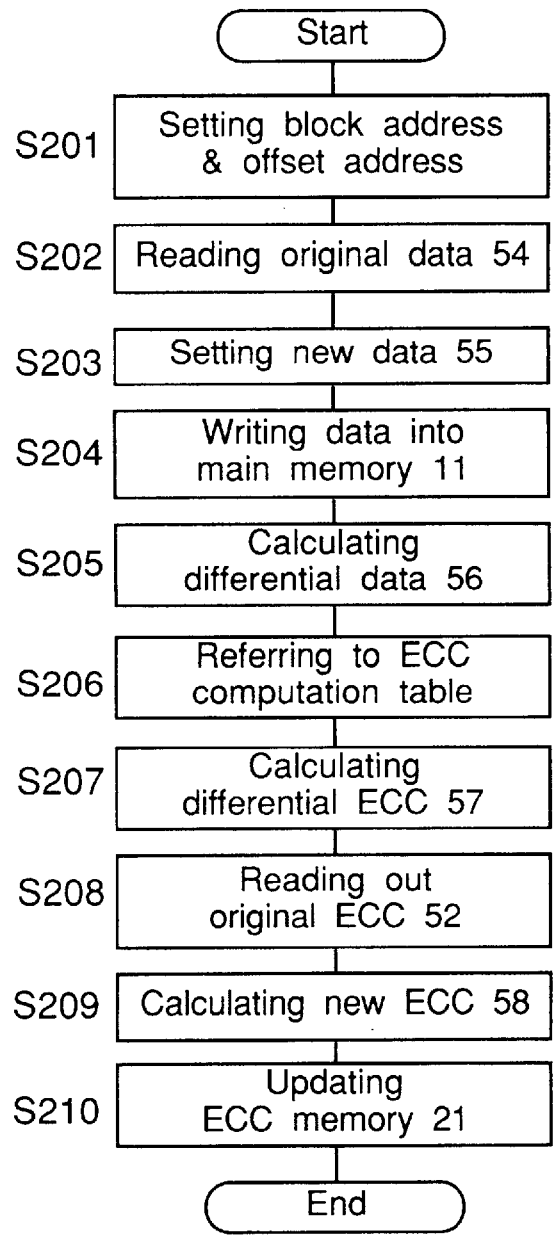
FIG. 6 is a flow chart showing the procedure for the ECC computation for a byte.

FIG. 5 shows the ECC computation when one-byte data 54 of the offset 1 of the data block 51 shown in FIG. 4 is updated. The data of the offset was updated from "11010010" to "10001101". The procedure for the ECC computation of this change is shown in a flow chart in FIG. 6.

When the information processing device sends, to the main memory 11 through the interface circuit 13, the offset address and the data block address for rewriting data there (S201), the error correction controller 25 reads the original data "11010010" before the rewrite (S202). New data 55 "10001101" is set to the main memory 11 through the data bus 31 (S203) and is written there (S204). The error correction controller 25 calculates a differential data 56 from the original data 54 obtained in the step S202 and the new rewritten data 55 (S205). The differential data shows a change in each bit and is obtained by taking an exclusive OR (XOR) between the original offset and the new offset.

The ECC computing circuit 19 refers to the ECC computation table 53 (S206), and computes difference ECCs 57 which are the ECCs corresponding to the difference data 56 (S207). The ECC control circuit 23 retrieves the ECCs 52 "010110" of the original data from the ECC memory 21 (S208). The error correction controller 25 adds the original ECCs 52 and the difference ECCs 57 in modulo-two to obtain the new ECCs 58 (S209). The ECC memory 21 is updated with the new ECCs 58 (S210).

When data is updated, the memory card of the present embodiment computes the ECCs only for the bytes that have been changed instead of for the entire data block. This reduces the time for computing the ECCs and efficiently updates the ECCs. This efficiency will be more significant for the larger block size.

In the above, the data block length is assumed to be four bytes for the sake of simplicity, which requires six bits for the ECCs. If the data block length is 256 bytes, only twelve bits for the ECCs are necessary. In this case the necessary capacity for a 4 MByte memory card is just 24 kBytes.

Thus, the memory card of the present embodiment comprises the error correction circuit 15 which is able to perform the error correction for the data stored in the memory card and thus making the data of the memory card more reliable.
Embodiment 2.

In the above description of Embodiment 1 the ECCs are updated every time the data is updated. On the other hand, the memory card of the present embodiment performs a process referred to as the "ending procedure" periodically or just before the card is disconnected from the information processing device in response a control signal sent through the external bus 35 from the information processing device. In the ending procedure the ECCs of the data of the memory card are updated all at once. A detailed description of the ending procedure follows.

Figure 7:
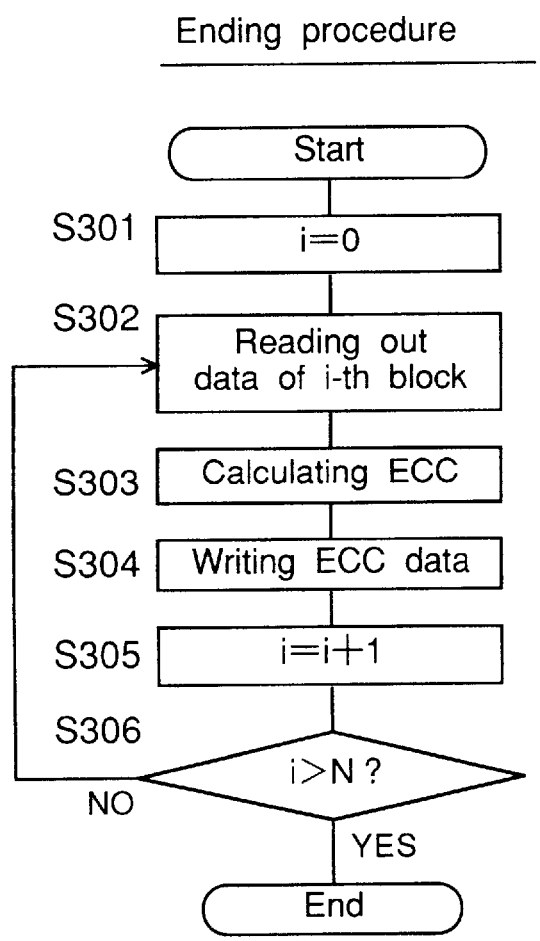
FIG. 7 is a flow chart of the ending procedure of the memory card of Embodiment 2 of the present invention.

FIG. 7 is a flow chart of the ending procedure. First, the error correction controller 25 initializes the index i to zero which indicates the block number to be processed (S301). Next the error correction controller 25 sends the block address of the i-th block to the main memory 11 and reads the data of the i-th block (S302). The ECC computing circuit 19 performs the ECC computation on the retrieved data (S303). The error correction controller 25 stores the computed ECCs in the ECC memory 21 (S304). Then the index i is incremented by one to specify the next data block to work on (S305).

In order to determine whether or not the ECCs of all the data blocks have been computed, the index i is compared with the number of blocks N (S306). If the index is not greater than N, that is, if the ECC computation has not been performed for all the blocks, the operation goes back to the step S302 where the ECC computation starts for the next block. The above steps are repeated until the ECC computation is performed for all the blocks. When the ECCs for all the blocks is completed, the operation ends.

Thus, the memory card of the present embodiment performs the ending procedure on the data of the main memory 11 all at once either periodically or just before the card is removed from the information processing device. This scheme reduces the writing process time as compared to that for Embodiment 1 in which the ECCs are computed every time data is written.
Embodiment 3.

Figure 8:
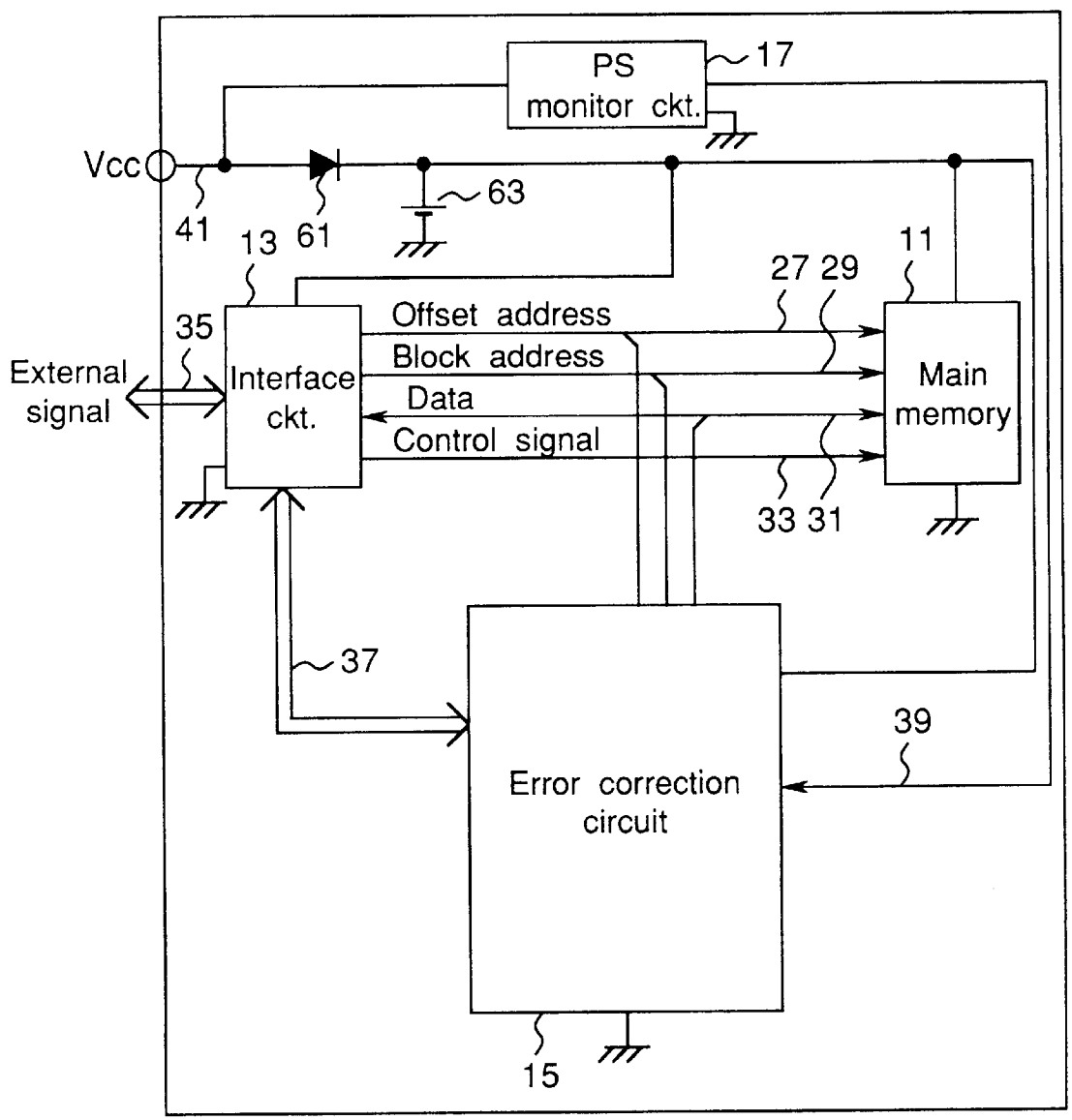
FIG. 8 is a block diagram showing the memory card of Embodiment 3 of the present invention.

FIG. 8 shows the memory card of Embodiment 3. The memory card of the present embodiment further comprises, in addition to the one shown in FIG. 1, a diode 61 and a backup battery 63. The diode 61 is connected to the power supply terminal Vcc on its cathode and to the power supply input terminal of the interface circuit 13 on its anode. The backup battery 63 is rechargeable and is connected to the anode of the diode 61 on its positive terminal and grounded on its negative terminal. The diode 61 prevents a current from flowing from the backup battery to the power supply monitor circuit 17. The backup battery 63 is recharged from the power supply of the information processing device while the memory card is connected thereto.

In the present embodiment, even after the memory card is disconnected from the information processing device, power is provided to the main memory 11, the interface circuit 13, and the error correction circuit 15 for a predetermined period of time. When the memory card is disconnected, the power supply monitor circuit 17 detects a drop in the power supply voltage and sends a control signal to the error correction circuit 15 when the voltage is below a predetermined value. After receiving this control signal, the error correction circuit 15 performs the "ending procedure" of ECC computation for the stored data all at once.

Thus, the memory card of the present embodiment comprises a backup battery 63 which provides power to the circuits of the memory card for a predetermined period of time after the power is shut off from the information processing device so that the error correction circuit 15 is able to perform the ending procedure. This ensures that the ECCs of the data of the memory card are generated by the ending procedure every time the memory card is disconnected from the information processing device. This improves the reliability of the memory card. Also, users do not need to worry about the ending procedure when they remove the memory card.

The capacity of the backup battery can be relatively small because it only needs to be on while the ending procedure is being performed. It should be noted that in the present embodiment a rechargeable battery is used as a backup battery but that a capacitor of a large capacitance can also replace the battery.

Embodiment 4.

Figure 9:
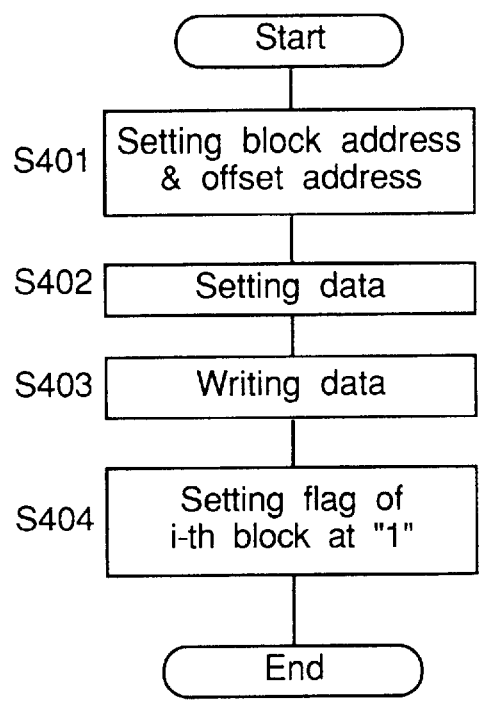
FIG. 9 is a flow chart showing the procedure for setting a flag bit.

The memory card of the present embodiment provides, in the error correction controller 25, registers including flag bits which indicate whether or not individual blocks have had updates of their data. The error correction controller 25 can identify blocks which have been updated by referring to the flag bits of the registers. The procedure for setting a flag bit in those registers will be described by referring to the flow chart shown in FIG. 9.

In writing data in the main memory 11, a block address and an offset address are first set in the main memory through the block address bus 29 and the offset address bus 27 respectively (S401). Then data is set through the data bus 31 (S402) and the data is written in the main memory (S403). The error correction controller 25 sets a flag corresponding to the block which had a data update to a "1" (S404). Thus the flag in the registers has been set for the block that had a data update.

Figure 10:
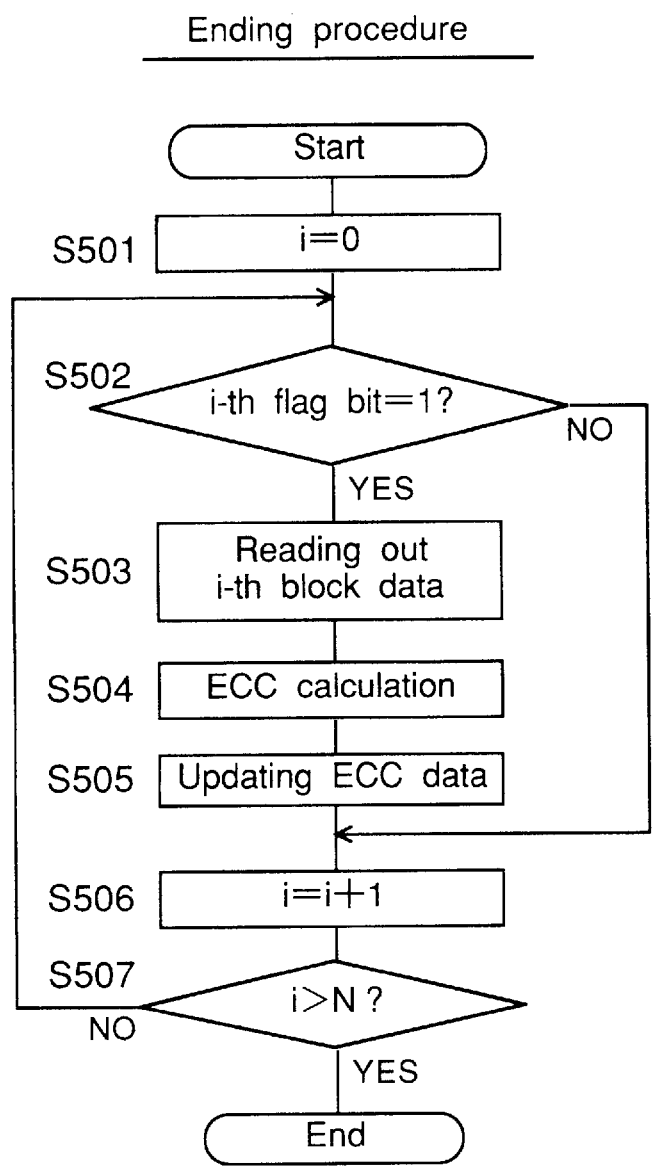
FIG. 10 is a flow chart of the ending procedure performed by referring to the flag bits.

FIG. 10 is a flow chart of the ending procedure performed by referring to flag bits. First, the index i, indicating the block number, is initialized to zero (S501). The error correction controller 25 refers to the flag bit of the i-th block in the registers and check to see whether or not the flag bit is set to a "1" (S502). If the flag bit is a "0", the error correction controller 25 determines that the data of the block has not been updated. Then the operation advances to the step S506. If the flag bit is a "1", the error correction controller 25 determines that the data of the block has been updated and retrieves the data of the i-th block (S503). The ECC computing circuit 19 computes the ECCs for this data by the same procedure described above (S504). Then the old ECC values stored in the ECC memory 21 are updated by the newly computed ECC values.

In the step S506, the index i is incremented by one to specify the next flag bit to check. In order to determine whether or not all the flag bits in the registers have been checked, the index i is compared with the number of blocks N (S507). If the bits have not all been checked, the operation goes back to the step S502 and the aforementioned process is repeated until all the flag bits are checked. When all the flag bits have been checked, the operation ends. All the flag bits are reset to a "0" after the initializing process or the ending procedure is completed.

Thus, when data is written, the memory card of the present embodiment sets a flag bit for each block that has had a data update. The memory card examines the flag bit of each block and performs the ECC computation only for those blocks that have had a data update. This scheme reduces the process time of the ending procedure.

The memory card of the present invention comprises an error correction circuit which detects and corrects errors generated in the data stored in the memory card by computing its error correction codes. Thus the reliability of the memory card is improved. The computation of error correction codes is performed in blocks. Accordingly, this method decreases the time needed for the computation and keeps the size of the error correction codes small. The error correction is performed by the memory card without giving any burden to the information processing device.

A preferable memory card of the present invention comprises a battery means which provides power to the memory elements and to the error correction means even after the memory card is disconnected from the information processing device. Accordingly, the error correction means is able to compute the error correction codes for the data stored in the memory card after the memory card is removed. Therefore, the error correction codes need not be computed every time data is written. Thus the writing time of this memory card is shorter than that of a memory card which computes the error correction codes every time data is written. Also, users can remove the memory card with no concern for the error correction process.

Another preferable memory card of the present invention comprises a recording means for recording the number of a block which has undergone data update. The data correction means identifies blocks which have undergone data update and computes the error correction codes for only such blocks that have undergone data update. Therefore, the process time for the computation of the error correction codes is reduced.

According to another preferable memory card, the error correction codes for updated data are computed by first computing the difference data, which is the difference between the updated bytes of the updated data and their corresponding bytes of the original data, where the updated bytes are the bytes which have actually been altered from the original bytes. Then the error correction codes for the difference data are computed. The error correction codes for the updated data are obtained based on the error correction codes for the difference data. Thus the error correction codes for the updated data are not computed for the entire block, but only for the bytes which have actually been altered from their original bytes. Therefore, the computing time of the error correction codes is reduced and the efficiency of writing process is improved.

In the first method of error correction of the present invention, data stored in the memory elements is read in blocks when the memory card is connected to the information processing device or when the memory card receives a control signal from the information processing device. Then data errors are identified and corrected by means of the error correction codes for the retrieved data. This method improves the reliability of the data when the memory card is used.

In the second method of data correction of the present invention, the error correction codes are not updated every time data is written in the memory card. The update operation is performed on the data stored in the memory elements all at once when the memory card is removed from the information processing device or when the memory card receives a control signal from the information processing device. Thus the writing time of this method is reduced as compared to that of the method in which the error correction codes are computed every time data is written.

In the third method of data correction of the present invention, the error correction codes for the updated data are computed by first computing the difference data, which is the difference between the updated bytes of the updated data and their corresponding bytes of the original data, where the updated bytes are the bytes which have actually been altered from their original bytes. Then the error correction codes for the difference data are computed. The error correction codes for the updated data are obtained based on the error correction codes for the difference data. Thus the error correction codes for the updated data are not computed for the entire block, but only for the bytes which have actually been altered from their original bytes. Therefore, the computing time of the error correction codes is reduced and the efficiency of the writing process is improved.

Although the present invention has been fully described in connection with the preferred embodiment thereof with reference to the accompanying drawings, it is to be noted that various changes and modifications are apparent to those skilled in the art. Such changes and modifications are to be understood as included within the scope of the present invention as defined by the appended claims unless they depart therefrom.

What is claimed is:

1. A rewritable memory card comprising:

an interface circuit for interfacing between said memory card and an external information processor to which said memory card is connected;

a main memory for storing data sent through said interface circuit from the external information processor in units of blocks having a predetermined byte length; and an error correction circuit for computing error correction codes for all the block data stored in said memory, finding an error of the data based on the computed error correction codes, and correcting the error of the data, said error correction circuit including a flag means for indicating that data has been written in a particular block.

2. The memory card of claim 1, wherein said error correction circuit includes:

an ECC computing unit for computing the error correction codes, in blocks, for the data stored in said main memory;

an ECC memory unit for storing the error correction codes computed by said ECC computing unit;

an ECC control unit for comparing error correction codes computed for updated data with error correction codes previously computed for corresponding original data stored in said ECC memory unit, said ECC control unit producing a signal indicating the result of the comparison; and an error correction control unit for finding and correcting errors based on the result of the comparison produced by said ECC control unit.

3. The memory card of claim 2, wherein said ECC computing unit computes the error correction code for updated data by first computing difference data, which is a difference between corresponding bytes of the original data which has been stored in the same area as the updated data, then by computing a difference error correction code, which is the error correction code for the difference data, and by adding the difference error correction code to the original error correction code for the original data.

4. The memory card of claim 1, further comprising rechargeable battery means for providing power to both said main memory and said error correction circuit for a predetermined period of time after the memory card is removed from the information processing device.

5. A method of data correction for a rewritable memory card having a main memory that stores data in units of blocks having a predetermined byte length and that is capable of retaining data when disconnected from an information processing device, said method comprising steps of:

(a) indicating that data has been written in a particular block;

(b) reading all the data of a block stored in the main memory that has been indicated as containing written data;

(c) computing an error correction code for the data of the block which has been read;

(d) comparing the error correction code just computed with an error correction code previously computed for the data which has been stored in the main memory; and (e) identifying data errors based on results of the comparison and correcting the data errors, the memory card correcting the data stored in the main memory when the memory card receives a control signal from the information processing device.

6. A method of data correction for a rewritable memory card, having a main memory that stores data in units of blocks having a predetermined byte length and that is capable of retaining data when removed from the information processing device, said method comprising steps of:

(a) reading all the data of a block stored in said memory;

(b) computing the error correction code for all said data of the block which has been read; and (c) updating the error correction code previously computed for the data with newly computed error correction code, the memory card updating the error correction codes for all the data stored in the main memory at once when the memory card is removed from the information processing device or when the memory card receives a control signal from the information processing device.

7. A method of data correction for a rewritable memory card, having a main memory that stores data in units of blocks having a predetermined byte length and being capable of retaining data when disconnected from an information processing device, said method comprising steps of:

(a) computing difference data which is a difference between bytes of updated data to be rewritten and corresponding bytes of original data which A been stored in the same area as the updated data;

(b) computing difference error correction code, which is the error correction code for the difference data; and (c) adding the difference error correction code to the original error correction code for old data, the memory card computing the error correction codes for new data to replace old data.

8. A rewritable memory card comprising:

an interface circuit for interfacing between said memory card and an external information processor to which said memory card is connected;

a main memory for storing data sent through said interface circuit from the external information processor in units of blocks having a predetermined byte length; and an error correction circuit for computing error correction codes for all the data stored in said main memory, finding an error in the data based on the computed error correction codes, and correcting the error in the data, said error correction circuit including:

an ECC computing unit for computing the error correction codes, in blocks, for the data stored in said main memory, said ECC computing unit computing error correction codes for updated data by first computing difference data, which is a difference between bytes to be rewritten of the updated data and corresponding bytes of original data which have been stored in the same area as the updated data, then by computing a difference error correction code, which is an error correction code for the difference data, and by adding the difference error correction code to the error correction code for the original data;

an ECC memory unit for storing the error correction codes computed by said ECC computing unit;

an ECC control unit for comparing the error correction codes computed for the updated data with error correction codes previously computed for corresponding original data stored in said ECC memory unit, said ECC control unit producing a signal indicating a result of the comparison; and an error correction control unit for finding and correcting errors based on the result of the comparison produced by said ECC control unit.

9. A memory card comprising:

main memory means for storing original electronic data and updated electronic data in units of blocks, the updated electronic data including a differing data portion different from a corresponding portion of the original electronic data and an identical data portion identical to a corresponding portion of the original electronic data; and error correction means for computing a difference error correction code for the differing data portion of the updated electronic data.

10. The memory card of claim 9, said error correction means further including flag means for indicating that a particular block contains written data, said error correction means computing error correction codes for blocks that have been indicated as containing written data by said flag means.

11. The memory card of claim 10, wherein said flag means indicates that a particular block contains updated electronic data, and said error correction means computes the updated error correction code for a block that has been indicated as containing updated electronic data by said flag means.

12. The memory card of claim 9, said error correction means further including flag means for indicating that a particular block contains updated electronic data, said error correction means computing the difference error correction code for a block that has been indicated as containing updated electronic data by said flag means.

13. The memory card of claim 9, wherein said error correction means computes an original error correction code for the original electronic data and computes an updated error correction code for the updated electronic data from the original error correction code and the difference error correction code.

14. The memory card of claim 9, further comprising rechargeable battery means for providing power to both said main memory means and said error correction means for a predetermined period of time after the memory card is removed from an information processing device.

* * * * *